United States Patent
Yano et al.

(10) Patent No.: US 7,533,308 B2
(45) Date of Patent: May 12, 2009

(54) SEMICONDUCTOR TEST SYSTEM

(75) Inventors: Tomomi Yano, Kawasaki (JP); Kozo Okamoto, Kawasaki (JP); Takumi Morimoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 300 days.

(21) Appl. No.: 11/081,684

(22) Filed: Mar. 17, 2005

(65) Prior Publication Data

US 2006/0083084 A1  Apr. 20, 2006

(30) Foreign Application Priority Data

Oct. 15, 2004  (JP) .............................. 2004-301258

(51) Int. Cl.
  *G11C 29/00* (2006.01)
(52) U.S. Cl. ................................ 714/710; 714/3; 714/5
(58) Field of Classification Search ...................... 714/7, 714/11, 710, 711
  See application file for complete search history.

(56) References Cited

U.S. PATENT DOCUMENTS 5,136,704 A * 8/1992 Danielsen et al. ............. 714/11
5,428,769 A * 6/1995 Glaser et al. .................... 700/4
6,115,828 A * 9/2000 Tsutsumi et al. ............... 714/7
6,327,675 B1 * 12/2001 Burdett et al. ................. 714/11
7,089,448 B2 * 8/2006 Hinshaw et al. ................ 714/6

FOREIGN PATENT DOCUMENTS

| JP | 9-7388 | 1/1997 |
|---|---|---|
| JP | 9-153021 | 6/1997 |
| JP | 2000-285696 | 10/2000 |

\* cited by examiner

*Primary Examiner*—Cynthia Britt
*Assistant Examiner*—Steve Nguyen
(74) *Attorney, Agent, or Firm*—Westerman, Hattori, Daniels & Adrian, LLP.

(57) ABSTRACT

The semiconductor test system comprises a test device for testing semiconductor devices including redundant circuits to obtain fail information of defective parts of the semiconductor devices; a redundant remedy judging device which includes fail memories for storing the fail information, and a redundant remedy judging unit for judging based on the fail information stored in the fail memories as to whether or not the redundant remedy replacing the defective parts of the semiconductor devices with the redundant circuits can be made, and which is provided independent of the test device, wherein the test device and the redundant remedy judging device are interconnected with each other via a network, and fail information is transmitted from the test device to the redundant remedy judging device.

9 Claims, 6 Drawing Sheets

SEMICONDUCTOR TEST SYSTEM

CROSS-REFERENCE TO RELATED APPLICATIONS

This application is based upon and claims priority of Japanese Patent Application No. 2004-301258, filed on Oct. 15, 2004, the contents being incorporated herein by reference.

BACKGROUND OF THE INVENTION

The present invention relates to a semiconductor test system, more specifically a semiconductor test system for use in testing semiconductor devices including redundant circuits.

In a semiconductor memory, such as DRAM or others, generally, redundant circuits, which remedy defects in the memory cell array, are formed. In such a semiconductor device including such redundant circuits, after the operation test is performed, defective parts are remedied by being replaced with the redundant circuits with a laser repair device or others.

Figure 5:
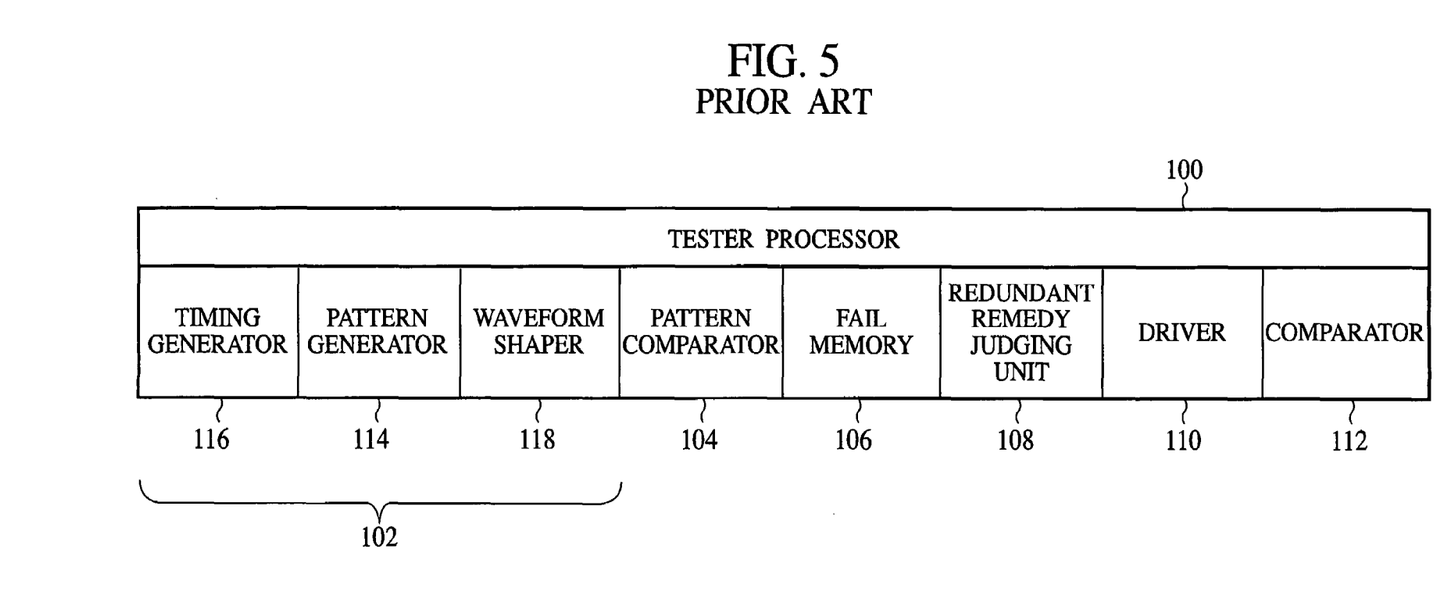
FIG. 5 is a block diagram of the conventional semiconductor test device, which illustrates the constitution thereof.

FIG. 5 is a diagrammatic view of the conventional semiconductor test device for use in testing semiconductor memories, etc., which illustrates the constitution thereof.

As illustrated, the conventional semiconductor test device comprises a tester processor 100, a test pattern generating unit 102, a pattern comparator 104, a fail memory 106, a redundant remedy judging unit 108, a driver 110 and a comparator 112.

The tester processor 100 controls the sequence of the entire semiconductor test device.

The test pattern generating unit 102 generates waveforms (test patterns) to be inputted to semiconductor devices to be tested and comprises a pattern generator 114, a timing generator 116 and a waveform shaper 118. The pattern generator 114 generates patterns, based on programmed data. The timing generator 116 generates timing signals for the patterns generated by the pattern generator 114. The waveform shaper 118 generates waveforms (test patterns) to be supplied to semiconductor devices to be tested, based on the timing signals generated by the timing generator 116 and the patterns generated by the pattern generator 114.

The driver 110 inputs a test pattern generated by the waveform shaper 118 of the test pattern generating unit 102 to the semiconductor devices to be tested.

The comparator 112 receives output waveforms outputted by the semiconductor devices to be tested in which the test pattern has been inputted and compares the received output waveform signals with a reference voltage, and selects either of voltage signals of H (High) level and L (Low) level, based on comparison results and outputs the selected voltage signals. The voltage signals outputted by the comparator 112 are supplied to the pattern comparator 104 as output data in terms of the time axis and the level of the output waveforms outputted by the semiconductor device to be tested.

The pattern comparator 104 compares programmed expectation value data with output data from the comparator 112 and judges the output data. Information of the comparison results given by the pattern comparator 104 is supplied to the tester processor 100. The tester processor 100 generates fail information of defective parts of the semiconductor device to be tested, based on the information of the comparison and judgment results given by the pattern comparator 104.

The fail memory 106 stores fail information.

The redundant remedy judging unit 108 judges based on fail information stored in the fail memory 106 whether or not the redundant remedy for replacing defective parts of the semiconductor device to be tested can be made. When the redundant remedy judging unit 108 judges that the redundant remedy can be made, the redundant remedy judging unit 108 generates redundant remedy data to be used in the redundant remedy by a laser repair device or others.

When the redundant remedy judging unit 108 judges that the redundant remedy can be made, the redundant remedy for replacing the defective parts with redundant circuits is made by using a laser repair device or others, based on the redundant remedy data generated by the redundant remedy judging unit 108.

The background arts of the present invention are disclosed in e.g., Japanese published unexamined patent application No. Hei 9-7388 (1997), Japanese published unexamined patent application No. Hei 9-153021 (1997) and Japanese published unexamined patent application No. 2000-285696 (2000).

However, in the test using the conventional semiconductor test device described above, the redundant remedy judging unit of the device is used only in the step of the test before the redundant remedy is made. That is, the redundant remedy judging unit is unnecessary in the steps of the test after the redundant remedy is made.

Figure 6:
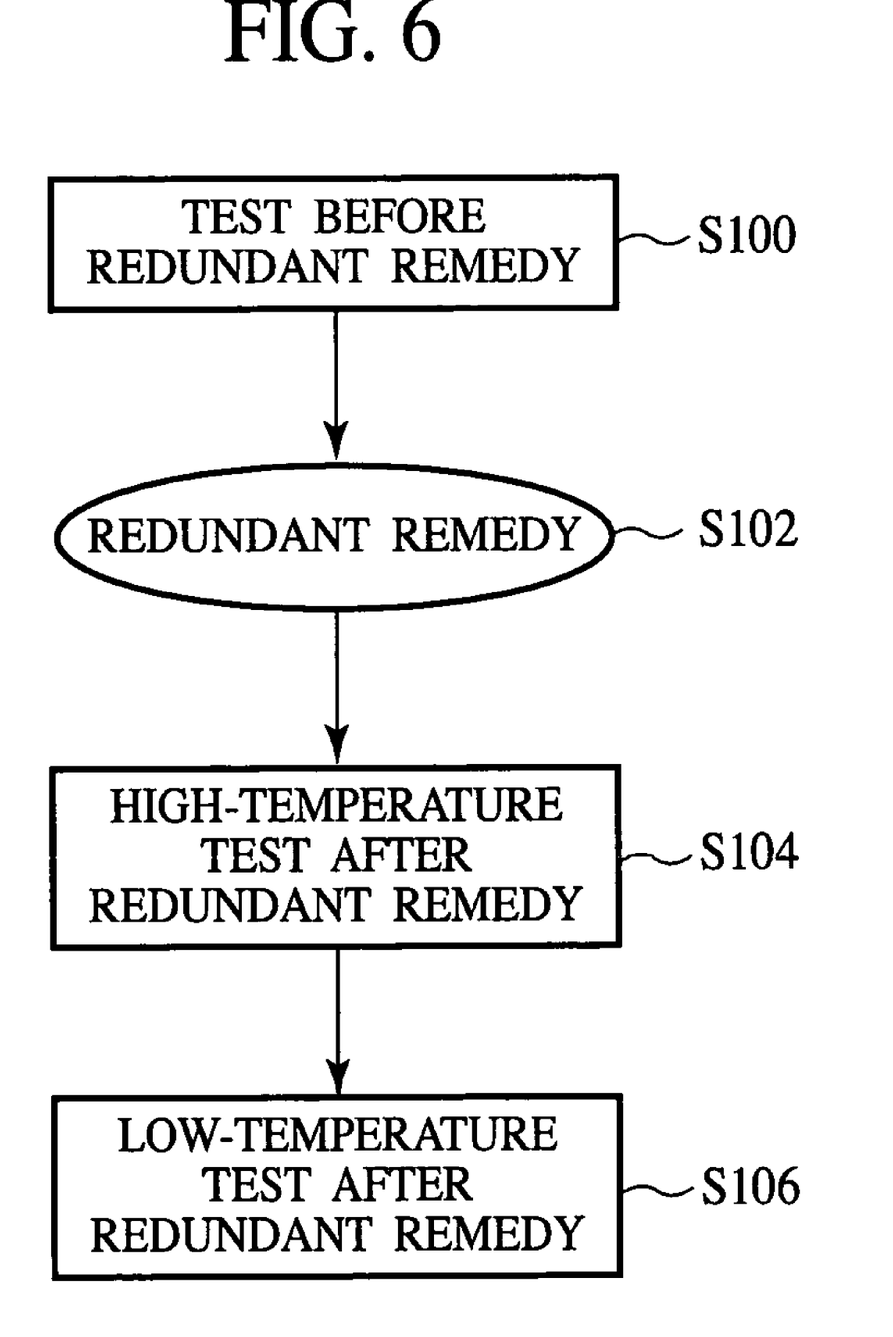
FIG. 6 is the flow chart of the test by the semiconductor test device.

As exemplified in FIG. 6, in the process of testing with the semiconductor test device, the step of test before the redundant remedy S100, the step of the redundant remedy S102, the step of high-temperature test after the redundant remedy S104 and the step of low-temperature test after the redundant remedy S106 are sequentially performed. In such process of testing semiconductor devices, as described above, the redundant remedy judging unit is used only in the step of test before the redundant remedy S100 but is not used in the step of high-temperature test after the redundant remedy S104 and the step of low-temperature after the redundant remedy S106. Accordingly, the operation of the redundant remedy judging unit is about ⅓ to ½ of the series of the test steps.

As described above, it cannot be said that the redundant remedy judging unit of the test device is effectively used in the test process with the conventional semiconductor test device.

The memory capacity of the fail memory for fail information to be stored in varies with capacities, etc. of semiconductor memories to be tested. Accordingly, a fail memory having a capacity as large as possible must be mounted on the semiconductor test device so that the semiconductor test device can be used widely in testing various semiconductor devices having semiconductor memories of different capacities. This is a cause for increasing the price of the semiconductor test device.

Furthermore, when semiconductor devices which require memory capacities exceeding the maximum capacity of the fail memory which has been used appear because of integration increases, etc., the semiconductor test device so far used for the test cannot be used. In such case, a semiconductor test device which is usable for the new semiconductor devices must be purchased, or a smaller number of the semiconductor devices must be concurrently tested with the test efficiency being sacrificed. Actually, whenever new semiconductor devices thus appear as semiconductor devices make changes, high expenses are frequently burdens.

Accordingly, it is required to form a semiconductor test device or semiconductor test system which is flexibly applicable to large capacities, etc. of semiconductor devices to be tested without burdens of cost increases.

SUMMARY OF THE INVENTION

An object of the present invention is to provide a semiconductor test system which is flexibly applicable to large capacities, etc. of the semiconductor devices to be tested without burdens of cost increases.

According to one aspect of the present invention, there is provided a semiconductor test system comprising: a test device for testing a semiconductor device including a redundant circuit and obtaining fail information of a defective part of the semiconductor device; and a redundant remedy judging device provided independently of the test device, and including a fail memory for storing the fail information and a redundant remedy judging unit for judging based on the fail information stored in the fail memory as to whether or not a redundant remedy for replacing the defective part of the semiconductor device with the redundant circuit can be made, the test device and the redundant remedy judging device being interconnected with each other via a network, the fail information being transmitted from the test device to the redundant remedy judging device.

According to another aspect of the present invention, there is provided a redundant remedy judging device connected via a network to a test device which tests a semiconductor device including a redundant circuit to obtain fail information of a defective part of the semiconductor device, the redundant remedy judging device comprising: a fail memory for storing the fail information transmitted from the test device; and a redundant remedy judging unit for judging based on the fail information stored in the fail memory as to whether or not a redundant remedy for replacing the defective part of the semiconductor device with the redundant circuit can be made.

According to further another aspect of the present invention, there is provided a test device for testing a semiconductor device including a redundant circuit and obtaining fail information of a defective part of the semiconductor device, the test device being connected via a network to a redundant remedy judging device including a fail memory for storing the fail information, and a redundant remedy judging unit for judging based on the fail information stored in the fail memory as to whether or not a redundant remedy for replacing the defective part of the semiconductor device with the redundant circuit can be made, and transmitting the fail information to the redundant remedy judging device.

According to further another aspect of the present invention, there is provided a redundant remedy device to be used in a semiconductor test system comprising: a test device for testing a semiconductor device including a redundant circuit and obtaining fail information of a defective part of the semiconductor device; and a redundant remedy judging device which is connected to the test device via a network, which includes a fail memory for storing the fail memory transmitted by the test device, and a redundant remedy judging unit for judging based on the fail information stored in the fail memory as to whether or not a redundant remedy for replacing the defective part of the semiconductor device with the redundant circuit can be made, and which generates redundant remedy data for making the redundant remedy for replacing the defective part of the semiconductor device with the redundant circuit according to a result of the judgment, the redundant remedy device being connected to the redundant remedy judging device via the network and making the redundant remedy for replacing the defective part of the semiconductor device with the redundant circuit, based on the redundant remedy data transmitted by the redundant remedy judging device.

According to the present invention, the fail memory for storing fail information and the redundant remedy judging unit for judging based on the fail information as to whether or not a redundant remedy can be made are provided in the redundant remedy judging device independent of the test device which obtains the fail information and connected to the test device via a network, whereby when the capacity of the fail memory is insufficient for larger capacities of semiconductor devices to be tested, the redundant remedy judging device may be replaced with one with the fail memory of a sufficient capacity mounted, and it is not necessary to replace even the test device together with the redundant remedy judging device. Thus, the semiconductor test system according to the present invention is flexibly applicable to semiconductor device of larger capacities, etc. to be tested.

According to the present invention, when the semiconductor test system, in which the test device and the redundant remedy judging device are independent of each other, is renewed, either alone of the test device and the redundant remedy judging device can be renewed as required, or they are renewed at different timing. Thus, the test device and the redundant remedy judging device do not have to be renewed at once, which permits the semiconductor test system to be renewed at low costs.

The fail memory and the redundant remedy judging unit of the redundant remedy judging device are shared by a plurality of test devices via a network, which makes it unnecessary to provide the fail memory and the redundant remedy judging unit for each test device. Accordingly, the costs of the test devices can be decreased.

According to the present invention, the fail memory and the redundant remedy judging unit of the redundant remedy judging device are shared by a plurality of test devices via a network, whereby among facilities, such as factories, etc. where the test devices are installed, the redundant remedy judging unit which is surplus at one of the facilities can be assigned to another of them where the redundant remedy judging unit is short. Thus, the total cost of the facilities, such as factories, etc., can be decreased.

DETAILED DESCRIPTION OF THE INVENTION

Figure 1:
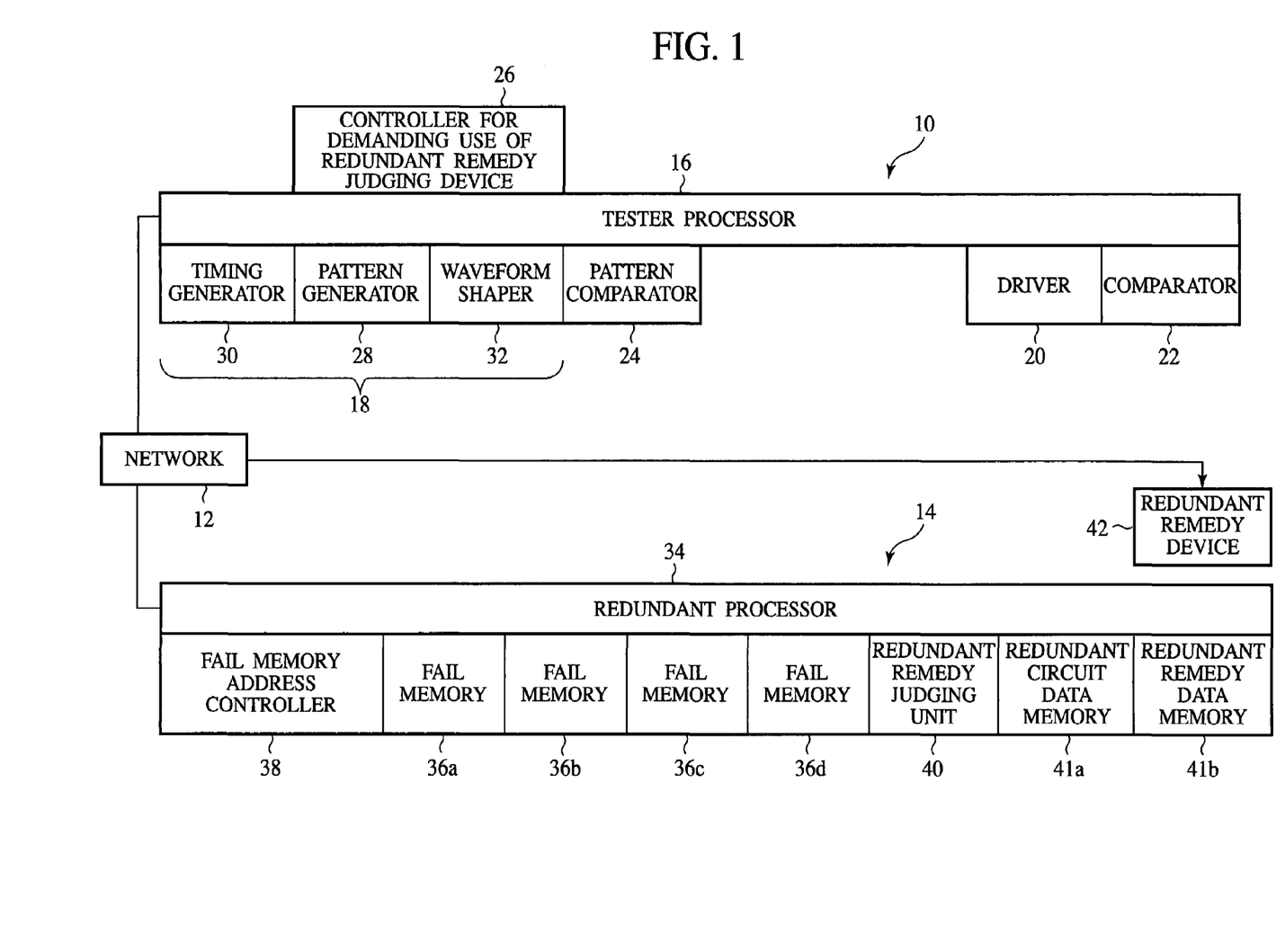
FIG. 1 is a block diagram of the semiconductor test system according to a first embodiment of the present invention, which illustrates a constitution thereof.
Figure 2:
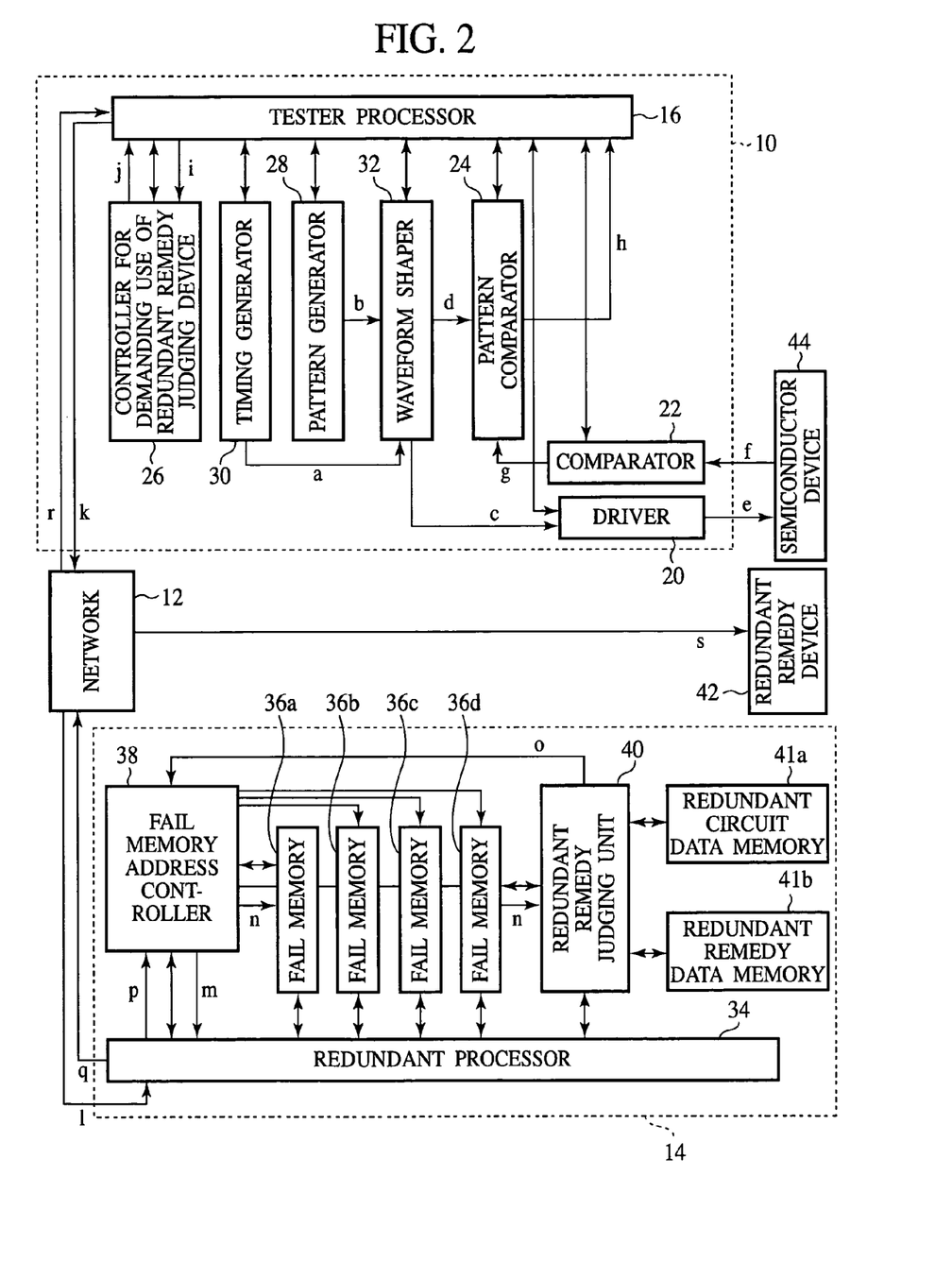
FIG. 2 is a block diagram of the semiconductor test system according to the first embodiment of the present invention, which illustrates the flows of information, data, etc.

The semiconductor test system according to a first embodiment of the present invention will be explained with reference to FIGS. 1 and 2. FIG. 1 is a block diagram of the semiconductor test system according to the present embodiment, which illustrates a constitution thereof. FIG. 2 is a block diagram of the semiconductor test system according to the present embodiment, which illustrates the flows of information, data, etc.

First, the semiconductor test system according to the present embodiment will be explained with reference to FIG. 1.

As illustrated, the semiconductor test system according to the present embodiment comprises a test device 10 for testing a semiconductor device to be tested, a redundant remedy judging device 14 for storing a test result given by the test device 10 and, based on the test result, judging whether or not redundant remedy can be made. Semiconductor devices to be tested are semiconductor memories, e.g., DERAM, etc.

(The Test Device)

The test device 10 generates test patterns, inputs the test patterns to semiconductor devices to be tested, compares output data outputted from the semiconductor devices to be tested and expectation value data and makes judgments, and make other operations. Specifically, the test device 10 comprises a data processor 16, a test pattern generating unit 18, a driver 20, a comparator 22, a pattern comparator 24, and a controller 26 for demanding use of the redundant remedy judging device 14 which will be described below.

The tester processor 16 controls the sequence of the entire test device 10.

The test pattern generating unit 18 generates waveforms (test patterns) to be inputted to semiconductor devices to be tested and comprises a pattern generator 28, a timing generator 30 and a waveform shaper 32. The pattern generator 28 generates patterns, based on programmed data. The timing generator 30 generates timing signal of the patterns generated by the pattern generator 28. The waveform generator 32 generates waveforms (test patterns) to be inputted to the semiconductor devices to be tested, based on the timing signals generated by the timing generator 30 and the patterns generated by the pattern generator 28. The waveform shaper 32 generates expectation value data to be references for defect judgment which are to be compared with output data outputted by the semiconductor devices to be tested, to which the test patterns have been inputted. The expectation data are, e.g., data which are expected to be outputted from the semiconductor devices when the semiconductor devices are normal.

The driver 20 inputs the test patterns generated by the waveform shaper 32 of the test pattern generating unit 18 to the semiconductor devices to be tested.

The comparator 22 obtains output waveforms outputted by the semiconductor devices to be tested to which the test patterns have been inputted, compares the signals of the obtained output waveforms with reference voltages, and selects either of H level voltage signals and L level voltage signals to output the selected voltage signals, based on the comparison result. The voltage signals outputted by the comparator 22 are supplied to the pattern comparator 24 as output data of the output waveforms outputted from the semiconductor devices, which are in terms of time axis and level.

The pattern comparator 24 compares the expectation value data generated by the waveform shaper 32 with the output data from the comparator 22 and makes judgments. The information of the comparison/judgment results is supplied to the tester processor 16. The tester processor 16 generates fail information of defective parts of the semiconductor devices to be tested.

The controller 26 for demanding use of the redundant remedy judging device 14 demands the use of the fail memories 36a-36d and the redundant remedy judging unit 40 of the redundant remedy judging device 14 from the redundant remedy judging device 14.

(The Redundant Remedy Judging Device)

The redundant remedy judging device 14 stores fail information given by the test device 10, judges based on the fail information whether or not the redundant remedy can be made, and make other operations, on demand from the test device 10. The redundant remedy judging device 14 is independent of the test device 10. Specifically, the redundant remedy judging device 14 comprises a redundant processor 34, fail memories 36a-36d, a fail memory address controller 38 and a redundant remedy judging unit 40.

The redundant processor 34 controls the sequence of the entire redundant remedy judging device 14.

The fail memories 36a-36d store the fail information given by the test device 10. The redundant remedy judging device 14 includes a plurality of fail memories 36a-36d.

The fail memory address controller 38 controls the assignment of the fail memories 36a-36d to the storage of the fail information on demand from the controller 26 for demanding use of the redundant remedy judging device 14 of the test device 10. Specifically, the fail memory address controller 38 controls which of a plurality of fail memories 36a-36d is assigned to the storage of the fail information and how much capacity of the assigned fail memory is used to store the fail memory information.

The redundant remedy judging unit 40 judges on demand from the controller 26 for demanding use of the redundant remedy judging device 14 of the test device 10 whether or not the redundant remedy for replacing defective parts of the semiconductor devices to be tested can be made, based on the fail information. The redundant remedy judging unit 40 is connected to a redundant circuit data memory 41a which stores redundant circuit data of the redundant circuits formed in the semiconductor devices to be tested. When the redundant remedy judging unit 40 judges whether or not the redundant remedy can be made, the redundant remedy judging unit 40 refers to the redundant circuit data stored in the redundant circuit data memory 41a to judge based on the fail information and the redundant circuit data whether or not the redundant remedy can be made.

When the redundant remedy judging unit 40 judges as to whether or not the redundant remedy can be made and judges that the redundant remedy is possible, the redundant remedy judging unit 40 generates redundant remedy data to be used in the redundant remedy by the redundant remedy device 42. The redundant remedy judging unit 40 is connected to a redundant remedy data memory 41b which temporarily stores the generated redundant remedy data.

The test device 10 and the redundant remedy judging device 14 described above are interconnected by a network 12, e.g., a LAN (Local Area Network), a WAN (Wide Area Network) or others. Thus, information, data, etc. can be exchanged between the test device 10 and the redundant remedy judging device 14.

Furthermore, the redundant remedy device 42 for making the redundant remedy for replacing defective parts of the semiconductor devices by the redundant circuits is connected to the network 12 interconnecting the test device 10 and the redundant remedy judging device 14. The redundant remedy device 42 can be, e.g., a laser repair device. The redundant remedy device 42 can exchange information, data, etc. with the redundant remedy judging device 14 via the network 12. The redundant remedy device 42 makes the redundant remedy on the semiconductor devices, based on the redundant remedy data supplied by the redundant remedy judging device 14 via the network 12.

The test device 10 and the redundant remedy judging device 14 interconnected with each other via the network 12 may be installed at the same place or different places in the same facilities or may be installed in different facilities.

Thus, the semiconductor test system according to the present embodiment is constituted.

The semiconductor test system according to the present embodiment is characterized mainly in that the fail memories 36a-36d and the redundant remedy judging unit 40 are disposed in the redundant remedy judging device 14 which is disposed independent of the test device 10, and the test device 10 and the redundant remedy judging device 14 are interconnected with each other via the network 12.

As illustrated in FIG. 5, each conventional semiconductor test device includes a set of fail memory 106 and the redundant remedy judging unit 108.

In the semiconductor test system according to the present embodiment, the fail memories 36a-36d and the redundant remedy judging unit 40 are separated from the test device 10, and the fail memories 36a-36d and the redundant remedy judging unit 40 are disposed in the redundant remedy judging device 14 connected to the network 12. Accordingly, when the capacities of the fail memories 36a-36d are insufficient for increased capacities of semiconductor devices to be tested, the redundant remedy judging device 14 may be simply substituted with one with fail memories of sufficient capacities. It is not necessary to replace the test device 10 together with the redundant remedy judging device 14. Thus, the semiconductor test system according to the present embodiment can be flexibly applicable to larger capacities, etc. of semiconductor devices to be tested without causing cost increases.

In renewing the semiconductor test system according to the present embodiment, in which the test device 10 and the redundant remedy judging device 14 are independent of each other, only one of the test device 10 and the redundant remedy judging device 14 is renewed, or both may not be renewed at the same time. In short, it is not necessary to renew both the test device 10 and the redundant remedy judging device 14 at once, which permits the semiconductor test system to be renewed at low costs.

A plurality of test devices 10 are connected to the redundant remedy judging device 14 via the network 12, whereby the fail memories 36a-36d and the redundant remedy judging unit 40 can be shared by a plurality of test devices 10. Thus, it is not necessary to provide the fail memories and the redundant remedy judging unit for each test device 10, which can decrease the cost of the test device 10.

Furthermore, the fail memories 36a-36d and the redundant remedy judging unit 40 of the redundant remedy judging device 14 are shared by a plurality of test devices 10 via the network 12, whereby among facilities, such as factories, etc. where the test devices 10 are installed, the redundant remedy judging unit 40 which is surplus at one of the facilities can be assigned to another of them where the redundant remedy judging unit 40 is short. Thus, the total cost of the facilities, such as factories, etc., can be decreased.

(Operation of the Semiconductor Test System)

Next, the operation of the semiconductor test system according to the present embodiment will be explained with reference to FIG. 2. In FIG. 2, the flows of information, data, etc. in the semiconductor test system according to the present embodiment are illustrated by arrows indicated by the alphabet (arrow a-arrow s).

First, the pattern generator 32 generates, based on programmed data, a pattern for generating a test pattern to be inputted to a semiconductor device 44 to be tested (arrow b). The timing generator 30 generates, based on the programmed data, a timing signal for generating the test pattern to be inputted to the semiconductor device 44 (arrow a).

Then, based on the timing signal generated by the timing generator 30 and the pattern generated by the pattern generator 28, the waveform shaper 32 generates a test pattern to be inputted to the semiconductor device 44 (arrow c). The waveform shaper 32 generates an expectation value data to be compared, in the pattern comparator 24, with output data outputted by the semiconductor device 44 and to be a reference for the judgment of defects (arrow d).

Next, the driver 20 inputs the test pattern generated by the waveform shaper 32 to the semiconductor device 44 (arrow e).

Output waveforms outputted by the semiconductor device 44, to which the test pattern has been inputted, are obtained by the comparator 22 (arrow f). The comparator 22 which has obtained the output waveforms compares signals of the obtained output waveforms with a reference voltage and selects either of a H level signal and a L level signal, based on a result of the comparison to output the selected voltage signal. The voltage signal outputted by the comparator 22 is supplied to the pattern comparator 24 as output data of output waveforms outputted by the semiconductor device 44, which is in terms of time axis and level (arrow g).

Then, the pattern comparator 24 compares the output data from the comparator 22 with the expectation value data generated by the waveform shaper 32 to make judgment. The pattern comparator 24, which has compared and made judgment, outputs information of the comparison/judgment results to the tester processor 16 (arrow h).

When the tester processor 16 receives the information of the comparison/judgment results from the pattern comparator 24, the tester processor 16 generates fail information of defective parts of the semiconductor device 44, based on the inputted comparison/judgment results. The tester processor 16, which has generated the fail information, outputs the fail information to the controller 26 for demanding use of the redundant remedy judging device 14 (arrow i).

When the fail information is inputted into the controller 26 for demanding use of the redundant remedy judging device 14, the controller 26 for demanding use of the redundant remedy judging device 14 generates a signal for demanding use of the redundant remedy judging device 14 and a signal for demanding use of fail memory (arrow j).

The signal for demanding use of the redundant remedy judging device 14 and the signal for demanding use of fail memory generated by the controller 26 for demanding use of the redundant remedy judging device 14 are transmitted by the tester processor 16 to the redundant processor 34 of the redundant remedy judging device 14 via the network 12. The fail information is also transmitted by the tester processor 16 to the redundant processor 34 of the redundant remedy judging device 14 via the network 12 (arrow k, arrow l).

The signal for demanding use of the redundant remedy judging device 14 is transmitted to the redundant processor 34, whereby the use of the redundant remedy judging device 34 is enabled, and whether or not the redundant remedy can be made is judged as follows, based on the fail information given by the test device 10.

The signal for demanding use of fail memory received by the redundant processor 34 is outputted to the fail memory address controller 38 by the redundant processor 34. The fail information is also outputted to the fail memory address controller 38 by the redundant processor 34 (arrow m).

When the signal for demanding use of fail memory is inputted to the fail memory address controller 38, the fail memory address controller 38 assigns the fail memories 36a-36d for storing the fail information to be transmitted from the test device 10. Specifically, the fail memory address controller 38 selects out of the fail memories 36a-36d fail memories which store the fail information and decides memory regions to be assigned to the selected fail memories. Then, the fail memory address controller 38 outputs the fail information together with assignment information of the fail memories and stores the fail information in the prescribed memory region of the selected fail memories (arrow n).

The redundant remedy judging unit 40 judges based on the fail information thus stored in the fail memories and the redundant circuit data stored in the redundant circuit data memory 41a as to whether or not the redundant remedy for replacing the defective parts of the semiconductor device 44 with the redundant circuits. Information of the judgment results are outputted to the fail memory address controller 38 by the redundant remedy judging unit 40 (arrow o).

When the redundant remedy judging unit 40 judges as to whether or not the redundant remedy is possible and judges that the redundant remedy is possible, the redundant remedy judging unit 40 generates redundant remedy data to be used in the redundant remedy by the redundant remedy device 42. The generated redundant remedy data is temporarily stored in the redundant remedy data memory 41b and is outputted by the redundant remedy judging unit 40 as required to the fail memory address controller 38.

The fail memory address controller 38 outputs, together with use information of the fail memories 36a-36d, information of the judgment results given by the redundant remedy judging unit 40 and the redundant remedy data to the redundant processor 34 (arrow p).

The redundant processor 34 transmits the redundant remedy data to the redundant remedy device 42 via the network 12 (arrow q, arrow s). The redundant processor 34 feeds back the information of the judgment results given by the redundant remedy judging unit 40, the use information of the fail memories 36a-36d to the tester processor 16 of the test device 10 (arrow q, arrow r).

Based on the redundant remedy data transmitted from the redundant remedy judging device 14, the redundant remedy device 42 makes the redundant remedy for replacing the defective parts of the semiconductor device 44 with the redundant circuits.

Thus, the semiconductor device 44 is tested by the test device 10, and based on test results of the test device 10, the redundant remedy judging device 14 judges whether or not the redundant remedy can be made. When the judgment that the redundant remedy is possible is made, the redundant remedy device 42 makes the redundant remedy for replacing defective parts of the semiconductor device 44, based on the redundant remedy data generated by the redundant remedy judging device 14.

As described above, according to the present embodiment, the fail memories 36a-36d and the redundant remedy judging unit 40 are provided in the redundant remedy judging device 14 provided independently of the test device 10, and the test device 10 and the redundant remedy judging device 14 are interconnected with each other via the network 12, whereby when the capacities of the fail memories 36a-36d become short due to capacity increases of semiconductor devices to be tested, the redundant remedy judging device 14 may be replaced with one with fail memories of sufficient capacities mounted which can meet the capacity increases, and it is not necessary to replace event the test device 10 together with the redundant remedy judging device 14. Thus, the semiconductor test system according to the present embodiment can flexibly applicable to large capacities, etc. of the semiconductor devices to be tested.

In renewing the semiconductor test system according to the present embodiment, in which the test device 10 and the redundant remedy judging device 14 are independent of each other, only one of the test device 10 and the redundant remedy judging device 14 is renewed, or both may not be renewed at the same time. In short, it is not necessary to renew both the test device 10 and the redundant remedy judging device 14 at once, which permits the semiconductor test system to be renewed at low costs.

Furthermore, the fail memories 36a-36d and the redundant remedy judging unit 40 of the redundant remedy judging device 14 are shared by a plurality of test devices 10 via the network 12, whereby among facilities, such as factories, etc. where the test devices 10 are installed, the redundant remedy judging unit 40 which is surplus at one of the facilities can be assigned to another of them where the redundant remedy judging unit 40 is short. Thus, the total cost of the facilities, such as factories, etc., can be decreased.

A Second Embodiment

Figure 3:
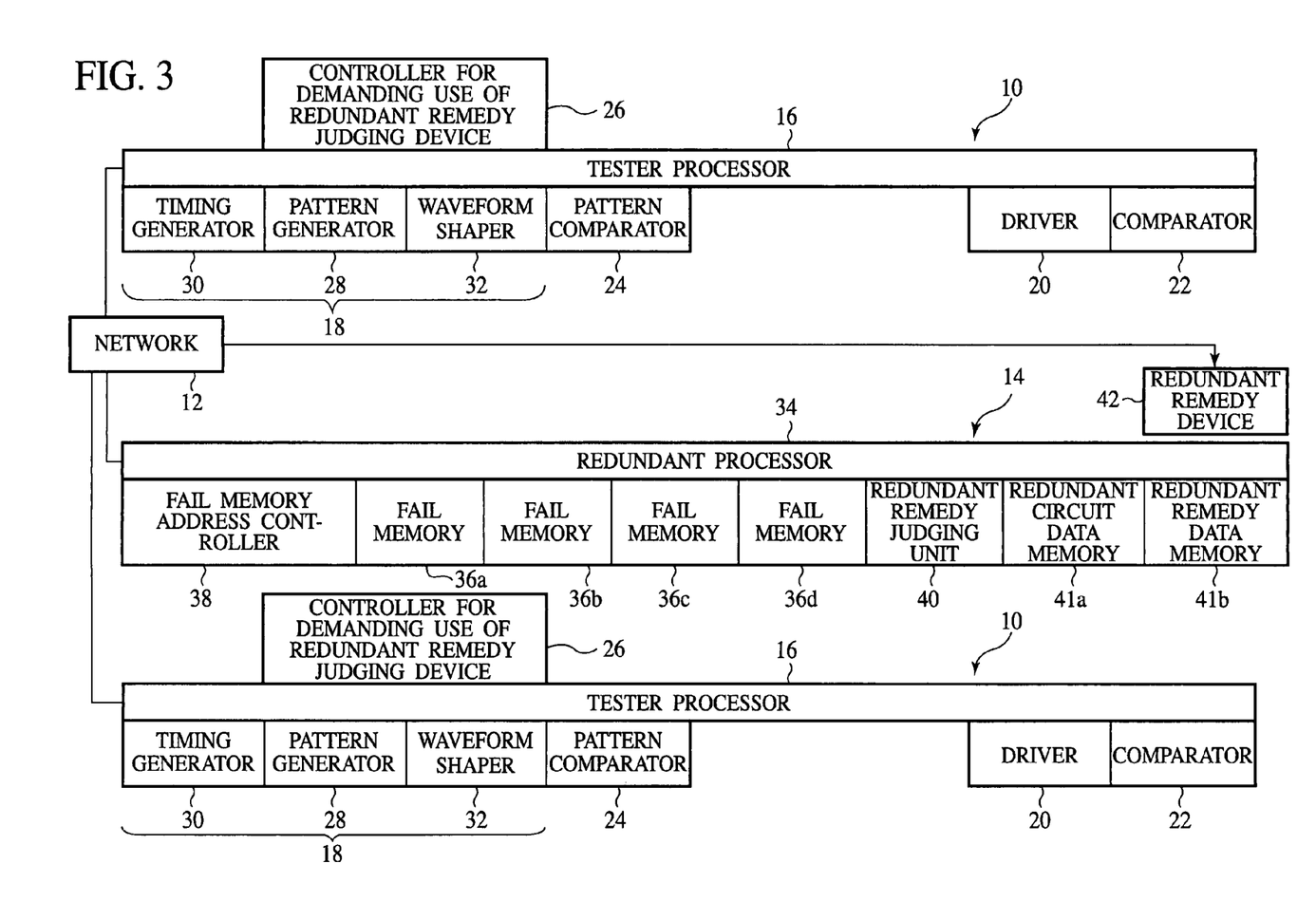
FIG. 3 is a block diagram of the semiconductor test system according to a second embodiment of the present invention, which illustrates a constitution thereof.

The semiconductor test system according to a second embodiment of the present invention will be explained with reference to FIG. 3. FIG. 3 is a block diagram of the semiconductor test system according to the present embodiment, which illustrates a constitution thereof. The same members of the present embodiment as those of the semiconductor test system according to the first embodiment are represented by the same reference numbers not to repeat or to simplify their explanation.

As illustrated in FIG. 3, in the semiconductor test system according to the present embodiment, a plurality of test devices 10 are connected to one redundant remedy judging device 14 via network 12. In FIG. 3, two test devices 10 are connected to one redundant remedy judging device 14 via the network 12. The test devices 10 and the redundant remedy judging device 14 have the same constitutions as those of the semiconductor test system according to the first embodiment.

A plurality of test devices 10 connected via the network 12 may be installed at the same place or different places in the same facilities, or may be installed facilities different from one another.

The test devices 10 and the redundant remedy judging device 14 interconnected via the network 12 may be installed at the same place or different places in the same facilities, or may be installed in facilities different from one another.

In the semiconductor test system according to the present embodiment, the redundant remedy judging device 14 judges whether or not the redundant remedy can be made and generates redundant remedy data in the same way as in the semiconductor test system according to the first embodiment on demand from each of said plurality of the test devices 10.

That is, the redundant remedy judging device 14 stores fail information given by one test device 10 in a prescribed memory region of fail memories 36a-36d on demand from said one test device 10 of said plurality of test devices 10. Based on this fail information, the redundant remedy judging device 14 judges whether or not the redundant remedy can be made on the semiconductor device tested by said one test device 10 and generates redundant remedy data.

On demand from the other test device 10 of said plurality of test devices 10, the redundant remedy judging device 14 stores fail information given by the other test devices 10 in another memory region of the fail memories 36a-36d. Based on the fail information, the redundant remedy judging device 14 judges whether or not the redundant remedy can be made on the semiconductor device tested by said other test device 10 and generates redundant remedy data for said semiconductor device.

The redundant remedy judging device 14 includes, in addition to the fail memories 36a-36d for storing the fail information, a memory (not illustrated) for storing various test results other than the fail information given by the respective rest devices 10.

As described above, the semiconductor test system according to the present embodiment is characterized mainly in that a plurality of test devices 10 are connected to one redundant remedy judging device 14 via the network 12, and the fail memories 36a-36d and the redundant remedy judging unit 40 of the redundant remedy judging device 14 are shared by said plurality of test devices 10 via the network 12.

The fail memories 36a-36d and the redundant remedy judging unit 40 of the redundant remedy judging device 14 are shared by a plurality of test devices 10 via the network 12, which makes it unnecessary to provide fail memories and the redundant remedy judging unit for each test device 10. This can accordingly reduce the costs of the test devices 10.

The fail memories 36a-36d and the redundant remedy judging unit 40 of the redundant remedy judging device 14 are shared by a plurality of test devices 10 via the network 12, whereby among facilities, such as factories, etc. where the test devices 10 are installed, the redundant remedy judging unit 40 which is surplus at one of the facilities can be assigned to another of them where the redundant remedy judging unit 40 is short. Thus, the total cost of the facilities, such as factories, etc., can be decreased.

Furthermore, a plurality of test devices 10 are connected to one redundant remedy judging device 14, whereby the redundant remedy judging device 14 can store various test results including the flail information given by the respective test devices 10. This permits the test results given by the respective test devices 10 to be administered collectively at one place, which makes the defect analyses of semiconductor devices to be effective. For example, tendencies of defects and distributions of the defect parts of semiconductor devices tested by the respective test devices 10 can be easily given.

A Third Embodiment

Figure 4:
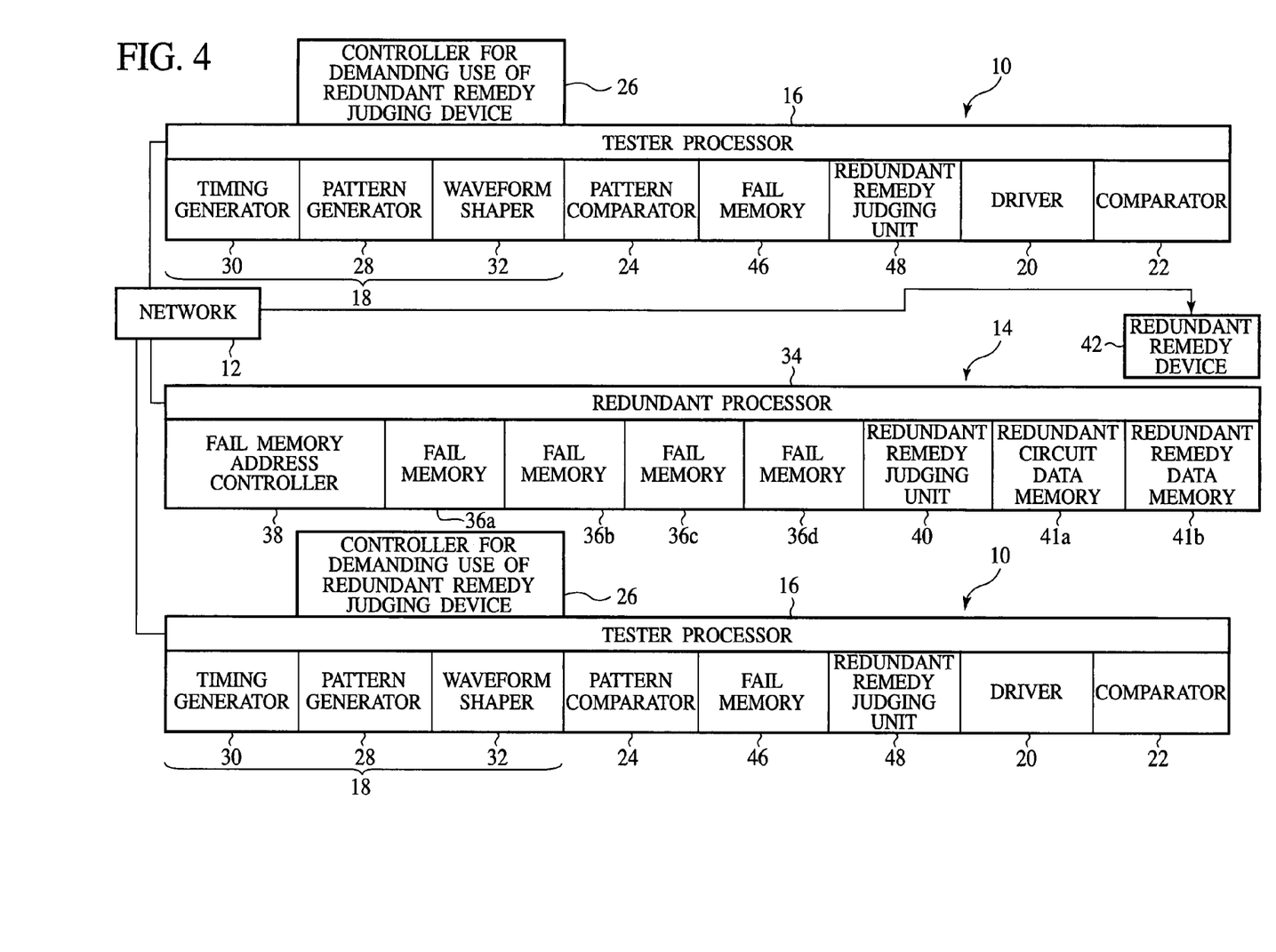
FIG. 4 is a block diagram of the semiconductor test system according to a third embodiment of the present invention, which illustrates a constitution thereof.

The semiconductor test system according to a third embodiment of the present invention will be explained with reference to FIG. 4. FIG. 4 is a block diagram of the semiconductor test system according to the present embodiment, which illustrates a constitution thereof. The same members of the present embodiment as those of the semiconductor test system according to the first and the second embodiments are represented by the same reference numbers not to repeat or to simplify their explanation.

The basic constitution of the semiconductor test system according to the present embodiment is substantially the same as that of the semiconductor test system according to the second embodiment, in which a plurality of test devices 10 are connected to one redundant remedy judging device 14 via a network 12. In the semiconductor test system according to the present embodiment, each of a plurality of test devices 10 includes a fail memory 46 and a redundant remedy judging unit 48.

As illustrated in FIG. 4, a plurality of test devices 10 are connected to one redundant remedy judging device 14 via the network 12. In FIG. 4, Two test devices 10 are connected to one redundant remedy judging device 14 via the network 12.

As in the test devices 10 of the first and the second embodiments, each test device 10 comprises a tester processor 16, a test pattern generating unit 18, a driver 20, a comparator 22, and a pattern comparator 24. Furthermore, each test device 10 comprises a fail memory 46 and a redundant remedy judging unit 48.

The fail memory 46 of each test device 10 stores fail information given by the test device 10, as do the fail memories 36a-36d of the redundant remedy judging device 14.

The redundant remedy judging unit 48 of each test device 10 judges based on fail information as to whether or not defects parts of semiconductor devices can be replaced with the redundant circuits, and generates redundant remedy data when the redundant remedy is possible.

As described above, the semiconductor test system according to the present embodiment is characterized mainly in that each test device 10 including the fail memory 46 and the redundant remedy judging unit 48, and the redundant remedy judging device 14 are interconnected with the network 12.

In the semiconductor test system according to the present embodiment, tests of semiconductor devices and the judgment as to whether or not the redundant remedy based on test results can be made are performed independently in the respective test devices 10 including the fail memory 46 and the redundant remedy judging unit 48.

That is, fail information obtained in each test device 10 is stored in the fail memory 46 of each test device 10. Then, the redundant remedy judging unit 48 of the each test device 10 judges based on the fail information stored in the fail memory 46 as to whether or not the redundant remedy can be made and generates redundant remedy data.

When the capacity of the fail memory 46 of each test device 10 is insufficient to store fail information, the fail memories 36a-36d of the redundant remedy judging device 14 can be used to store the fail information as will be described below.

That is, on demand from the test device 10 the capacity of whose fail memory is insufficient to store fail information, prescribed memory region of the fail memories 36a-36d of the redundant remedy judging device 14 is assigned to storing fail information via the network 12.

Fail information obtained in each test device 10 is stored thus separately in the fail memory 46 of each test device 10 and in the fail memories 36a-36d of the redundant remedy judging device 14.

The redundant remedy judging unit 48 of each test device 10 judges whether or not the redundant remedy can be made and generates redundant remedy data, based on fail information stored separately in the fail memory 46 and the fail memories 36a-36d.

As described above, in the semiconductor device according to the present embodiment, the redundant remedy judging device 14 including the fail memories 36a-36d is connected the test devices 10 via the network 12, whereby when the capacity of the fail memory 46 of each test device 10 is insufficient to store fail information, the fail information can be stored separately in the fail memory 46 and the fail memories 36a-36d of the redundant remedy judging device 14.

Furthermore, as in the semiconductor test system according to the second embodiment, a plurality of test devices 10 are connected to one redundant remedy judging device 14, whereby the redundant remedy judging device 14 can store various test results including the flail information given by the respective test devices 10. This permits the test results given by the respective test devices 10 to be administered collectively at one place, which makes the defect analyses of semiconductor devices to be effective. For example, tendencies of defects and distributions of the defect parts of semiconductor devices tested by the respective test devices 10 can be easily given.

Modified Embodiments

The present invention is not limited to the above-described embodiments and can cover other various modifications.

For example, in the above-described embodiments, the semiconductor test system is applied to semiconductor memories, such as DRAM, etc. as objects to be tested. However, the semiconductor test system according to the present invention is applicable to all semiconductor device including redundant circuits.

In the second and the third embodiments, a plurality of test devices 10 are connected to one redundant remedy judging device 14 via the network 12. The number of the test devices 10 connected via the network 12 can be suitably changed in accordance with a total capacity, etc. of the fail memories mounted on the redundant remedy judging device 14.

In the above-described embodiments, one test device 10 or a plurality of test devise 10 are connected to one redundant remedy judging device 14 via the network 12. The number of the redundant remedy judging devices 14 connected via the network 12 is not essentially one but may be plural. For example, a plurality of test devices 10 are connected to a plurality of redundant remedy judging devices 14 via the network 12, and said plurality of redundant remedy judging devices 14 may be shared by said plurality of test devices 10.

What is claimed is:

1. A semiconductor test system comprising: a test device for testing a semiconductor device including a redundant circuit and obtaining fail information of a defective part of the semiconductor device, the redundant circuit being formed in the semiconductor device in advance; and a redundant remedy judging device provided independently of the test device, and including a fail memory for storing the fail information and a redundant remedy judging unit for judging based on the fail information stored in the fail memory as to whether or not a redundant remedy of replacing the defective part of the semiconductor device with the redundant circuit can be made, the redundant circuit not becoming a component contributing an operation of the semiconductor device until the redundant remedy of replacing the defective part with the redundant circuit is made, the test device and the redundant remedy judging device being interconnected with each other via a network, the fail information being transmitted from the test device to the redundant remedy judging device, wherein the redundant remedy judging device is shared by a plurality of test devices via the network, and the semiconductor test system further comprises a redundant remedy device connected to the redundant remedy judging device via the network, for making the redundant remedy of replacing the defective part of the semiconductor device with the redundant circuit, based on redundant remedy data generated by the redundant remedy judging unit.

2. A semiconductor test system according to claim 1, wherein the test device includes a test pattern generator for generating a test pattern to be inputted to the semiconductor device; and a comparator for comparing output data outputted from the semiconductor device to which the test pattern has been inputted with expectation value data which is expected to be outputted from the semiconductor device when the semiconductor device is normal, and generating the fail information of the defective part of the semiconductor device based on a result of a comparison between the output data and the expectation value data.

3. A semiconductor test system according to claim 1, wherein the redundant remedy judging device further includes a storage unit for storing a result of testing the semiconductor device by the test device.

4. A semiconductor test system according to claim 2, wherein the redundant remedy judging device further includes a storage unit for storing a result of testing the semiconductor device by the test device.

5. A semiconductor test system according to claim 1, wherein the redundant remedy judging device further includes a storage unit for storing a result of testing the semiconductor device by the test device.

6. A redundant remedy judging device connected via a network to a test device which tests a semiconductor device including a redundant circuit to obtain fail information of a defective part of the semiconductor device, the redundant circuit being formed in the semiconductor device in advance, the redundant remedy judging device comprising:

a fail memory for storing the fail information transmitted from the test device; and a redundant remedy judging unit for judging based on the fail information stored in the fail memory as to whether or not a redundant remedy of replacing the defective part of the semiconductor device with the redundant circuit can be made, the redundant circuit not becoming a component contributing an operation of the semiconductor device until the redundant remedy of replacing the defective part with the redundant circuit is made, wherein the redundant remedy judging device is shared by a plurality of test devices via the network, and the redundant remedy judging device is connected via the network to a redundant remedy device for making the redundant remedy of replacing the defective part of the semiconductor device with the redundant circuit, based on redundant remedy data generated by the redundant remedy judging unit.

7. A redundant remedy judging device according to claim 6, wherein the redundant remedy judging unit generates redundant remedy data for making the redundant remedy of replacing the defective part to the semiconductor device with the redundant circuit and outputs the redundant remedy data to a redundant remedy device for making the redundant remedy of replacing the defective part of the semiconductor device with the redundant circuit, based on the redundant remedy data.

8. A test device for testing a semiconductor device including a redundant circuit and obtaining fail information of a defective part of the semiconductor device, the redundant circuit being formed in the semiconductor device in advance, the test device being connected via a network to a redundant remedy judging device including a fail memory for storing the fail information, and a redundant remedy judging unit for judging based on the fail information stored in the fail memory as to whether or not a redundant remedy of replacing the defective part of the semiconductor device with the redundant circuit can be made, and transmitting the fail information to the redundant remedy judging device, the redundant circuit not becoming a component contributing an operation of the semiconductor device until the redundant remedy of replacing the defective part with the redundant circuit is made, wherein the redundant remedy judging device is shared by a plurality of test devices via the network, and the redundant remedy judging device is connected via the network to a redundant remedy device for making the redundant remedy of replacing the defective part of the semiconductor device with the redundant circuit, based on redundant remedy data generated by the redundant remedy judging unit.

9. A redundant remedy device to be used in a semiconductor test system, the semiconductor test system comprising:

a test device for testing a semiconductor device including a redundant circuit and obtaining fail information of a defective part of the semiconductor device, the redundant circuit being formed in the semiconductor device in advance; and a redundant remedy judging device which is connected to the test device via a network, which includes a fail memory for storing the fail memory transmitted by the test device, and a redundant remedy judging unit for judging based on the fail information stored in the fail memory as to whether or not a redundant remedy of replacing the defective part of the semiconductor device with the redundant circuit can be made, and which generates redundant remedy data for making the redundant remedy of replacing the defective part of the semiconductor device with the redundant circuit according to a result of the judgment, the redundant circuit not becoming a component contributing an operation of the semiconductor device until the redundant remedy of replacing the defective part with the redundant circuit is made, the redundant remedy device being connected to the redundant remedy judging device via the network and making the redundant remedy of replacing the defective part of the semiconductor device with the redundant circuit, based on the redundant remedy data transmitted by the redundant remedy judging device, wherein the redundant remedy judging device is shared by a plurality of test devices via the network.

* * * * *